US012593717B2

(12) United States Patent
Kawasaki et al.

(10) Patent No.: US 12,593,717 B2
(45) Date of Patent: Mar. 31, 2026

(54) SEMICONDUCTOR DEVICE AND METHOD FOR MANUFACTURING SEMICONDUCTOR DEVICE

(71) Applicant: KIOXIA CORPORATION, Tokyo (JP)

(72) Inventors: Kazushige Kawasaki, Kawasaki (JP); Satoru Itakura, Tokyo (JP)

(73) Assignee: Kioxia Corporation, Tokyo (JP)

( * ) Notice: Subject to any disclaimer, the term of this patent is extended or adjusted under 35 U.S.C. 154(b) by 645 days.

(21) Appl. No.: 17/897,077

(22) Filed: Aug. 26, 2022

(65) Prior Publication Data

US 2023/0282536 A1 Sep. 7, 2023

(30) Foreign Application Priority Data

Mar. 7, 2022 (JP) ................................. 2022-034829

(51) Int. Cl.
*H01L 23/31* (2006.01)
*H01L 21/56* (2006.01)
(Continued)

(52) U.S. Cl.
CPC ........ *H01L 23/3128* (2013.01); *H01L 21/561* (2013.01); *H01L 23/552* (2013.01); *H01L 24/48* (2013.01); *H01L 25/0657* (2013.01); *H01L 21/568* (2013.01); *H01L 24/05* (2013.01); *H01L 24/32* (2013.01); *H01L 24/33* (2013.01); *H01L 24/45* (2013.01); *H01L 24/49* (2013.01); *H01L 24/73* (2013.01); *H01L 2224/05624* (2013.01); *H01L 2224/05644* (2013.01); *H01L 2224/05647* (2013.01); *H01L 2224/32145* (2013.01); *H01L 2224/32225*

(2013.01); *H01L 2224/33181* (2013.01); *H01L 2224/45139* (2013.01); *H01L 2224/45144* (2013.01); *H01L 2224/45147* (2013.01); *H01L 2224/45565* (2013.01); *H01L 2224/45664* (2013.01);
(Continued)

(58) Field of Classification Search
CPC ....................................................... H01L 23/552
See application file for complete search history.

(56) References Cited

U.S. PATENT DOCUMENTS 5,841,192 A 11/1998 Exposito
6,110,755 A 8/2000 Muramatsu et al.
(Continued)

FOREIGN PATENT DOCUMENTS

JP 2000133748 A 5/2000
JP 4485865 B2 6/2010
TW 201926590 A 7/2019

*Primary Examiner* — Yu-Hsi D Sun
(74) *Attorney, Agent, or Firm* — Kim & Stewart LLP

(57) ABSTRACT

According to one embodiment, a semiconductor device includes a wiring substrate having a first surface, a second surface opposite to the first surface, and a side surface connecting the first surface and the second surface. A first electrode is on the first surface. A semiconductor element is on the wiring substrate and electrically connected to the first electrode. A resin layer covers the semiconductor element and the first surface from a first direction orthogonal to the first surface. A portion of the resin layer contacts the side surface of the wiring substrate from a second direction parallel to the first surface. The resin layer has an outside side surface that is substantially parallel to the first direction.

6 Claims, 9 Drawing Sheets

(51) Int. Cl.
$\phantom{xx}$H01L 23/00$\phantom{xxxxx}$(2006.01)
$\phantom{xx}$H01L 23/552$\phantom{xxxx}$(2006.01)
$\phantom{xx}$H01L 25/065$\phantom{xxxx}$(2023.01)

(52) U.S. Cl.
$\phantom{xx}$CPC ............... *H01L 2224/48106* (2013.01); *H01L 2224/48145* (2013.01); *H01L 2224/48227* (2013.01); *H01L 2224/49175* (2013.01); *H01L 2224/73215* (2013.01); *H01L 2224/73265* (2013.01); *H01L 2225/06506* (2013.01); *H01L 2225/0651* (2013.01); *H01L 2225/06562* (2013.01)

(56) References Cited

U.S. PATENT DOCUMENTS

| | | | |
|---|---|---|---|
| 2006/0012033 A1 | 1/2006 | Noguchi | |
| 2009/0236700 A1 | 9/2009 | Moriya | |
| 2015/0255359 A1* | 9/2015 | Furutani | H01L 21/563 361/761 |
| 2019/0172791 A1 | 6/2019 | Kawabata | |
| 2021/0175182 A1* | 6/2021 | Paek | H01L 21/561 |

* cited by examiner

FIG. 4

| | |
|---|---|
| CUT AND DICE WIRING SUBSTRATE 100 INTO WIRING SUBSTRATES 10 | S1 |
| DISPOSE WIRING SUBSTRATES 10 ON SUPPORT SUBSTRATE 102 | S2 |
| DISPOSE SUPPORT SUBSTRATE 102 ON SUPPORT SUBSTRATE 104 | S3 |
| DISPOSE SEMICONDUCTOR CHIPS 50 AND 52 ON WIRING SUBSTRATES 10 | S4 |
| CONNECT WIRING SUBSTRATES 10 AND SEMICONDUCTOR CHIPS 50 AND 52 WITH WIRES | S5 |
| SEAL WIRING SUBSTRATES 10 WITH RESIN LAYER 70 | S6 |
| CUT BETWEEN WIRING SUBSTRATES 10 | S7 |
| REMOVE SUPPORT SUBSTRATES 102 AND 104 | S8 |
| FORM BUMP ELECTRODES 60 ON EACH WIRING SUBSTRATE 10 | S9 |

FIG. 5

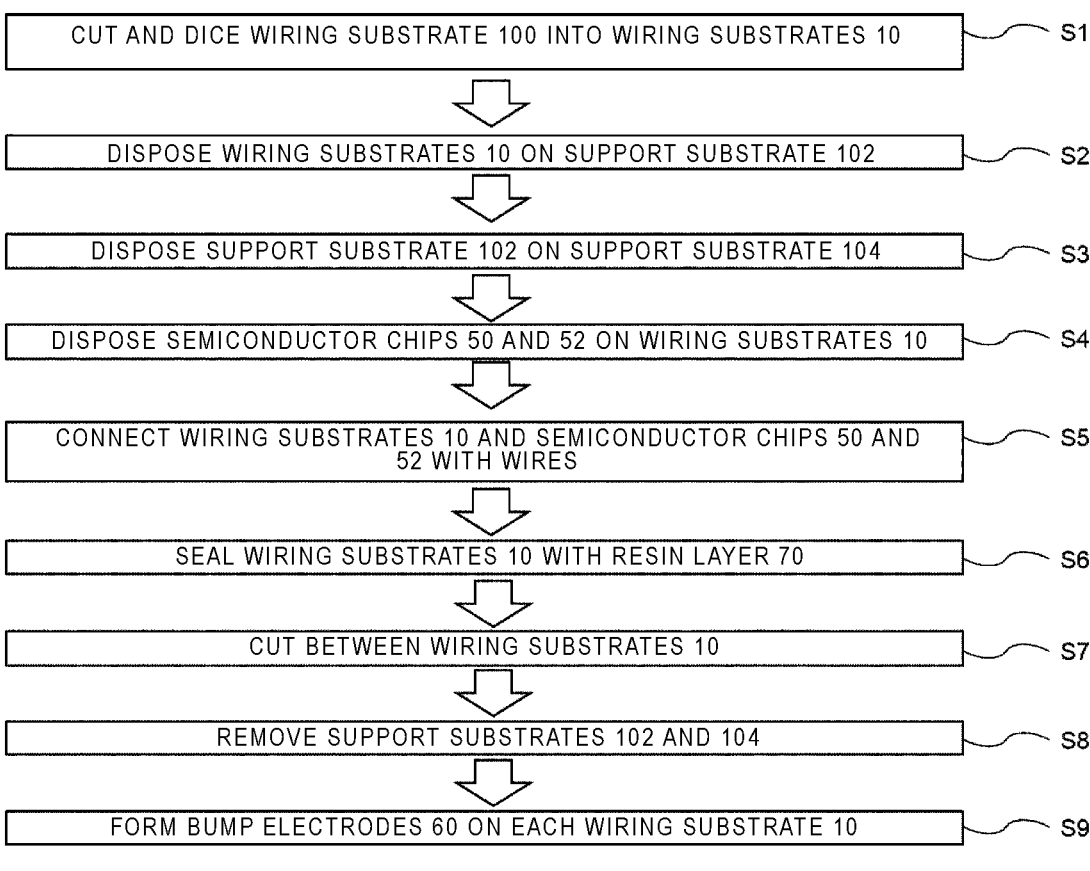

100

1

200

202

2

2

3A

3B

3A

3B

4A

4B

SEMICONDUCTOR DEVICE AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2022-034829, filed Mar. 7, 2022, the entire contents of which are incorporated herein by reference.

FIELD

Embodiments described herein relate generally to a semiconductor device and a method for manufacturing a semiconductor device.

BACKGROUND

There is a semiconductor device in which semiconductor chips stacked on a wiring substrate are sealed with a resin.

BRIEF DESCRIPTION OF THE DRAWINGS

FIG. 4 shows a method for manufacturing a semiconductor device according to the first embodiment.

FIGS. 5 to 11 show aspects related to a method for manufacturing a semiconductor device according to a first embodiment.

DETAILED DESCRIPTION

Figure 1:
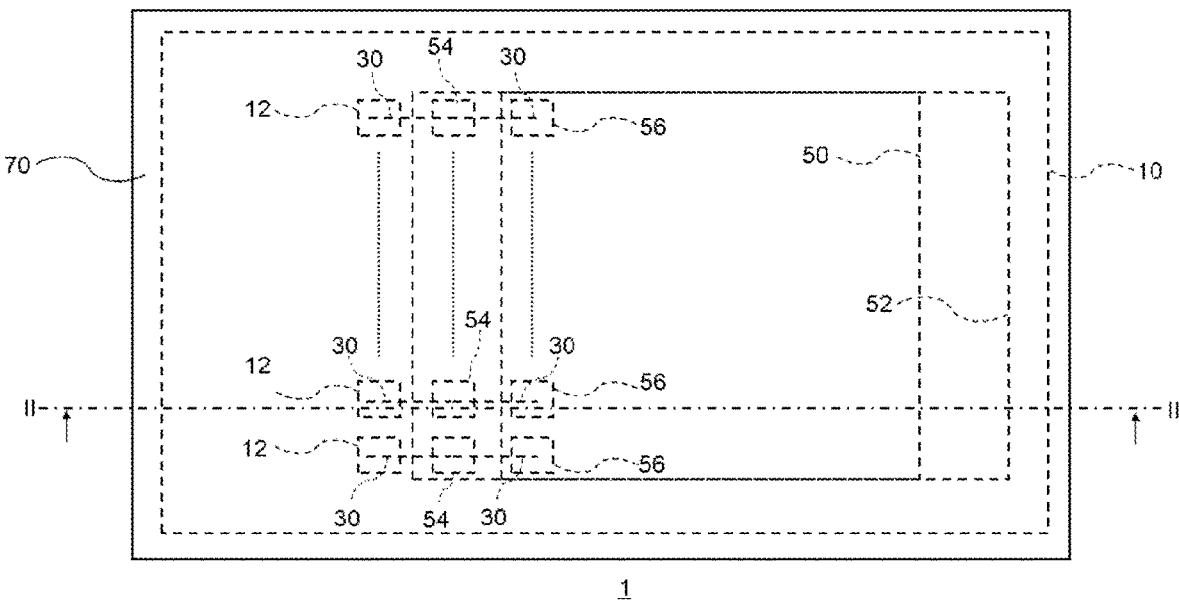
FIG. 1 is a top view of a semiconductor device according to a first embodiment.

Embodiments provide a semiconductor device sealed at a side surface of a wiring substrate, and a method for manufacturing the same.

In general, according to one embodiment, a semiconductor device includes a wiring substrate having a first surface, a second surface opposite to the first surface, and a side surface connecting the first surface and the second surface. A first electrode is on the first surface. A semiconductor element is on the wiring substrate and electrically connected to the first electrode. A resin layer covers the semiconductor element and the first surface from a first direction orthogonal to the first surface. A portion of the resin layer contacts the side surface of the wiring substrate from a second direction parallel to the first surface. The resin layer has an outside side surface that is substantially According to another embodiment, a semiconductor device includes: a wiring substrate that includes a first surface, a second surface opposite to the first surface, and a side surface connected to the first surface and the second surface, and in which wirings are formed inside and a first electrode is formed on the first surface; a semiconductor element that is provided on the wiring substrate and electrically connected to the first electrode; and a resin layer that seals the first surface of the wiring substrate and the semiconductor element, covers the side surface of the wiring substrate, and has a substantially vertical side surface.

According to still another embodiment, a method for manufacturing a semiconductor device includes: cutting and dicing a first wiring substrate into a plurality of second wiring substrates; placing the plurality of second wiring substrates on a first support substrate; providing semiconductor elements on the plurality of second wiring substrates; sealing the plurality of second wiring substrates and the semiconductor elements with a resin; separating the first support substrate and the plurality of second wiring substrates; and cutting the resin and separating the plurality of second wiring substrates.

The certain example embodiments are described in the following, but such examples are not intended to limit the present disclosure. In the following description, an upper-lower direction is based on a relative direction corresponding to when a surface of a wiring substrate on which a semiconductor chip is mounted is defined as an upper side. As defined the upper-lower direction may or may not correspond to a gravitational acceleration. The drawings are schematic or conceptual, and the depicted dimensions, proportions and the like of each portion are not necessarily the same as actual ones. In the drawings, components the same or substantially similar to those previously described with reference to a preceding figure are denoted by the same reference numerals, and repeated description thereof may be omitted.

First Embodiment

Figure 2:
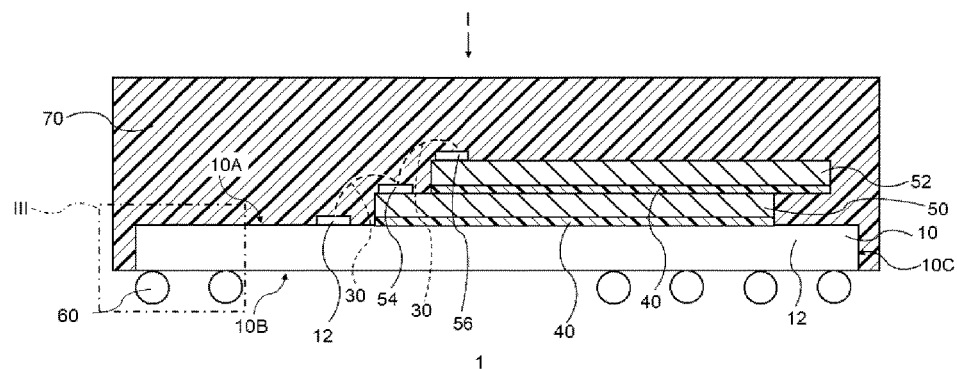
FIG. 2 is a cross-sectional view of a semiconductor device according to a first embodiment.
Figure 3:
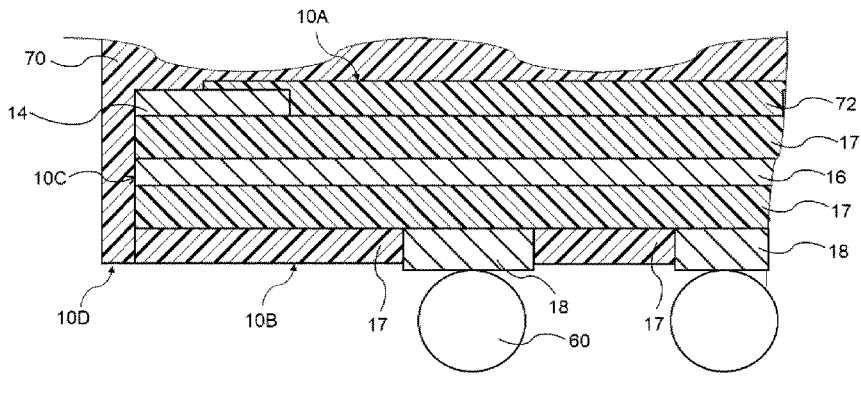
FIG. 3 is an enlarged cross-sectional view of a semiconductor device according to a first embodiment.

FIG. 1 is a top view showing an example of a configuration of a semiconductor device according to a first embodiment. FIG. 2 is a cross-sectional view taken along a line II-II of FIG. 1. FIG. 3 is a partially enlarged cross-sectional view of FIG. 2.

A semiconductor device 1 includes a wiring substrate 10, semiconductor chips 50 and 52, bonding wires 30, bump electrodes 60, and a resin layer 70. The wiring substrate 10 includes a first surface 10A, a second surface 10B opposite to the first surface 10A, and side surfaces 10C disposed between the first surface 10A and the second surface 10B and connected to the first surface 10A and the second surface 10B. Wiring layers 14 and 16 (see FIG. 3) and interlayer insulating films 17 (see FIG. 3) for providing insulation between the wiring layers are provided inside the wiring substrate 10. A part of the wiring layers 14 and 16 may be exposed from the side surfaces 10C of the wiring substrate 10. Each interlayer insulating film 17 may be made of a glass epoxy resin, ceramic, or the like.

The wiring substrate 10 may be, for example, a printed circuit board using a glass epoxy resin, or an interposer. The wiring substrate 10 includes pads 12 on the first surface 10A. The first surface 10A of the wiring substrate 10 may be covered with an insulating film 72 having an opening through which the pads 12 are exposed. For example, the insulating film 72 is a solder resist. Each pad 12 may contain aluminum, gold, copper, or a composite material thereof. The wiring substrate 10 includes pads 18 on the second surface 10B. The second surface 10B of the wiring substrate 10 may be further covered with an insulating film having an opening or openings through which the pads 18 are exposed. Each pad 18 may contain aluminum, gold, copper, or a composite material thereof. The pads 18 are provided with the bump electrodes 60. The bump electrodes 60 can be connected to an outside of the semiconductor device 1. The bump electrodes 60 and the pads 12 are electrically connected to each other via the pads 18 and at least one of the wiring layers 14 and 16.

The semiconductor chip 50 is provided on the first surface 10A of the wiring substrate 10. The semiconductor chip 50 is adhered to the first surface 10A of the wiring substrate 10 by an adhesive layer 40. The semiconductor chip 52 is adhered to the semiconductor chip 50 by the adhesive layer 40. The adhesive layer 40 may be a paste or a resin film such as a non-conductive paste (NCP) or a die attach film (DAF). The number of semiconductor chips to be stacked may be more than 2. The semiconductor chip 50 may be used alone without being stacked. A controller chip for controlling the semiconductor chips 50 and 52 may further be stacked. Such a controller chip may be separately provided on the first surface 10A rather than in a stack with the semiconductor chips 50 and 52.

The semiconductor chip 50 includes pads 54 electrically connected to semiconductor elements formed on a surface thereof. The semiconductor chip 52 includes pads 56 electrically connected to semiconductor elements formed on a surface thereof. The pads 54 and 56 contain aluminum, gold, copper, or a composite material thereof.

The pads 12 and 54 are connected by the bonding wires 30. The pads 54 and 56 are also connected by the bonding wires 30. Each bonding wire 30 is, for example, a metal wire such as an Au wire, a Cu wire, an Ag wire, or a Pd-coated Cu wire.

The semiconductor chips 50 and 52 and the bonding wires 30 on the wiring substrate 10 are sealed and protected with the resin layer 70. Furthermore, the side surfaces 10C of the wiring substrate 10 are also sealed and protected with the resin layer 70. The resin layer 70 has substantially vertical side surfaces along a direction perpendicular to the first surface 10A. A lower surface 10D of the resin layer 70 is substantially flush with the second surface 10B in this example. The resin layer 70 is a thermosetting resin and may be, for example, an epoxy resin or an acrylic resin. The resin layer 70 may be a resin material containing an inorganic filler. The inorganic filler is, for example, silica (silicon oxide). As the inorganic filler, for example, aluminum hydroxide, calcium carbonate, aluminum oxide, boron nitride, titanium oxide, and barium titanate may be added in addition to, or instead of, silica.

Effect

The semiconductor device 1 according to the first embodiment has high durability because the side surfaces 10C of the wiring substrate 10 are also sealed with the resin layer 70.

Manufacturing Method

A method for manufacturing a semiconductor device according to the first embodiment will be described with reference to an overview flowchart of FIG. 4.

Step S1

Figure 6:
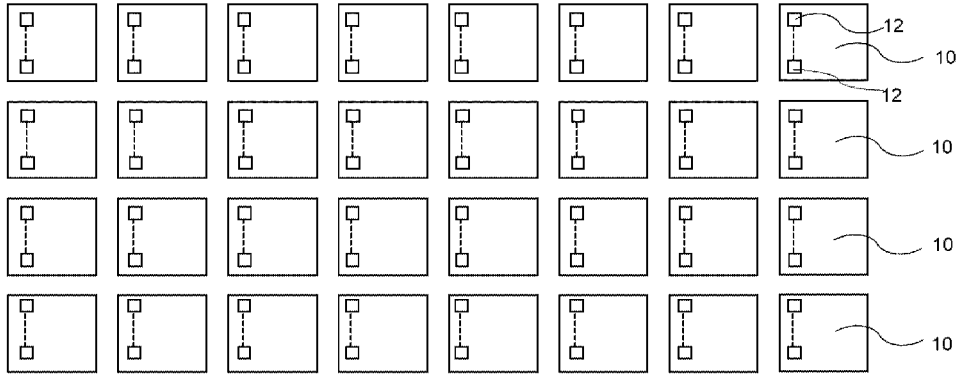

As shown in FIG. 5, a wiring substrate 100 includes a plurality of wiring substrates 10. The wiring substrate 100 has no or very few parts on an outer periphery that cannot be used as the wiring substrate 10. The wiring substrate 100 is cut and diced with a blade, a laser, or the like to separate the plurality of wiring substrates 10 as shown in FIG. 6.

Steps S2 and S3

Figure 7:
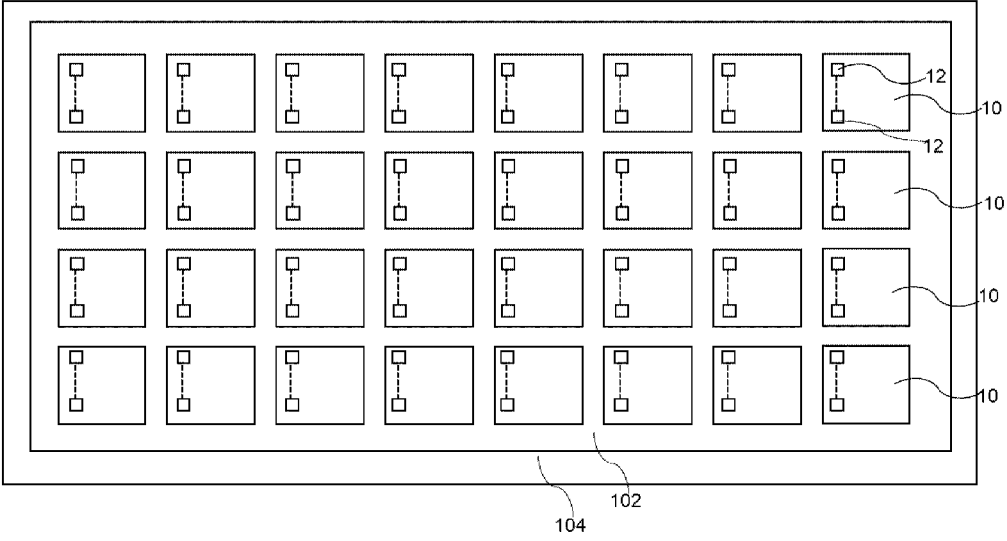

Thereafter, as shown in FIG. 7, the plurality of wiring substrates 10 are next disposed on a support substrate 102 having adhesiveness (an adhesive support substrate). The wiring substrates 10 are disposed so as not to sink into the support substrate 102. The support substrate 102 may be, for example, a UV release sheet. The support substrate 102 is then adhered to and fixed to a support substrate 104 that is more rigid than the support substrate 102. The support substrate 104 may be a glass substrate, a silicon substrate, a stainless-steel substrate, or the like.

Steps S4 and S5

Figure 8:
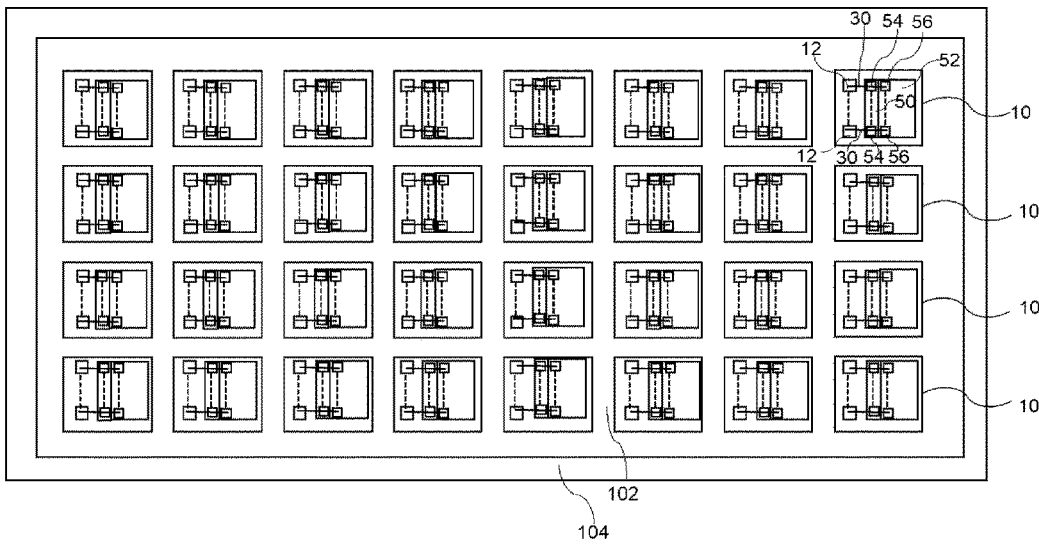

As shown in FIG. 8, the semiconductor chips 50 and 52 are provided on (stacked on) each wiring substrate 10, and the pads 12 of each wiring substrate 10 and the pads 54 and 56 of the semiconductor chips 50 and 52 are connected by the wires 30.

Step S6

Figure 9:
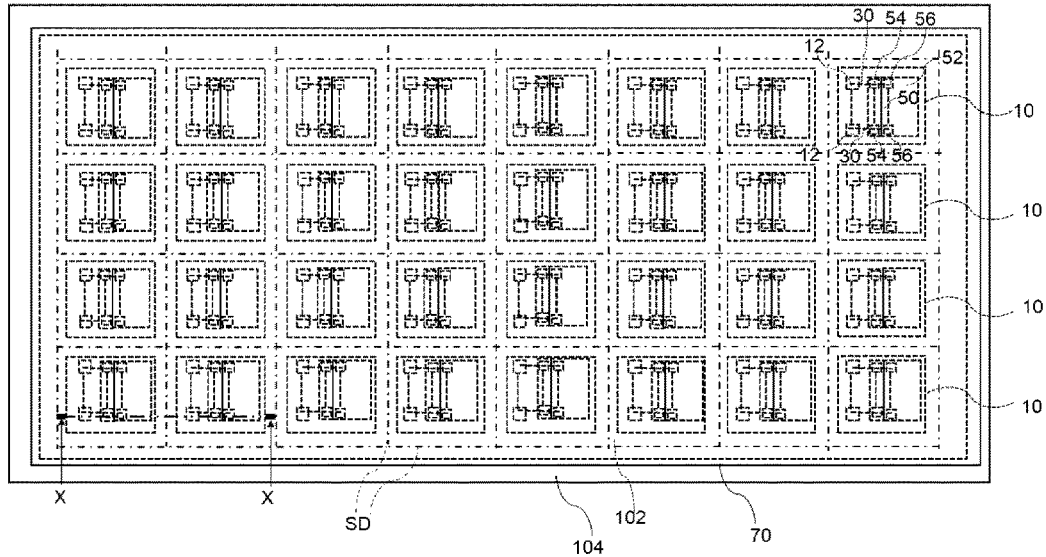
Figure 10:
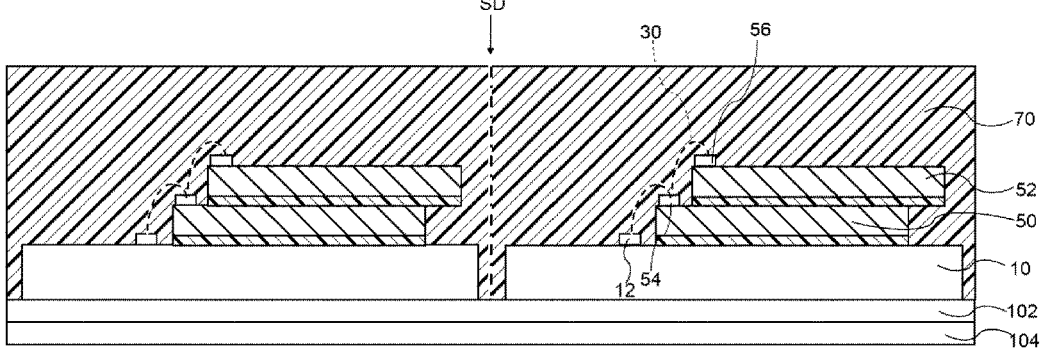

As shown in FIG. 9, the plurality of wiring substrates 10 and the semiconductor chips 50 and 52 are sealed with the resin layer 70. An outer periphery of the resin layer 70 is formed beyond an outer edge of the support substrate 102. However, in other examples, the outer periphery of the resin layer 70 may be formed inside the outer edge of the support substrate 102. FIG. 10 is an enlarged cross-sectional view of FIG. 9.

Step S7

Thereafter, cutting is performed along a cutting line SD shown in FIG. 10. The cutting may be performed with a blade or a laser. When cut by a blade, the side surface of the resin layer 70 will generally be rougher than an upper surface thereof. When cut with a laser, the side surface of the resin layer 70 may be rougher or finer than the upper surface thereof. However, the side surfaces and the upper surface of the resin layer 70 will still have different surface roughness.

Step S8

Figure 11:
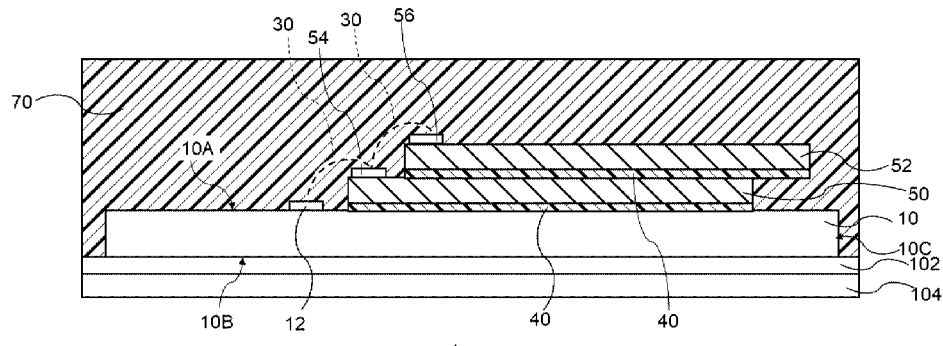

FIG. 11 shows a cross-sectional view of the wiring substrate 10 after the cutting and the chips after being stacked. The support substrate 102 and the support substrate 104 can now be removed. When the support substrate 102 is a UV release sheet and the support substrate 104 is a glass substrate, a laser is applied to the support substrate 102 through the support substrate 104 to release the support substrate 102.

Step S9

The bump electrodes 60 (see FIG. 2) are then formed. By the above steps, the semiconductor device 1 shown in FIGS. 1 to 3 is formed.

Figure 12:
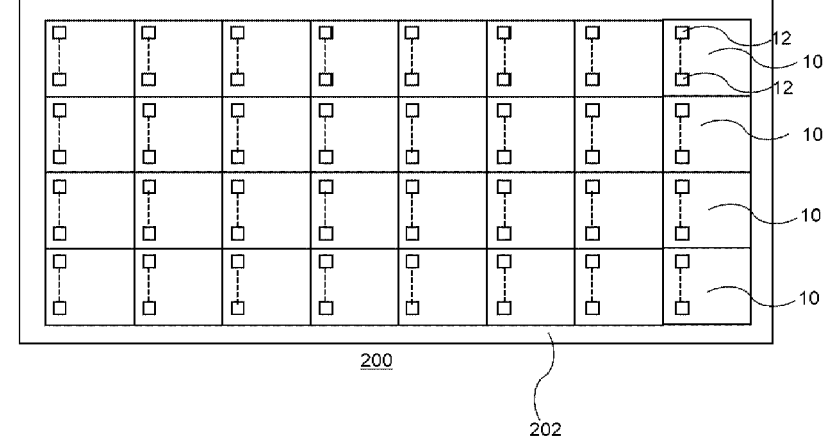
FIG. 12 shows aspects related to a method for manufacturing a semiconductor device according to a comparative example.

In the case of a wiring substrate 200 according to a comparative example, such as shown in FIG. 12, a peripheral edge portion 202 exists along an outer periphery of the wiring substrate 200. When the wiring substrate 200 is used, the wiring substrate 200 is not cut and diced into the plurality of wiring substrates 10 then mounted on support substrates such as depicted in FIG. 7, but rather the semiconductor chips 50 and 52 are stacked on the wiring substrate 200 and sealed with the resin layer 70 before the wiring substrates 10 are separated from one another. The wiring substrate 200 is cut into wiring substrates 10. The peripheral edge portion 202 is, for example, a portion against which a mold is pressed when sealing is performed with the resin layer 70, and is a portion that is not used in a process other than such a manufacturing process. After being cut into separate wiring substrates 10, the remaining peripheral edge portion 202 is discarded. Therefore, some portion of the original wiring substrate 200 is wasted. On the other hand, when the wiring substrate 100 is used, a portion such as the peripheral edge portion 202 does not exist, and the entire wiring substrate can be used. Therefore, when the wiring substrate 100 is used, there is no portion to be discarded after the end of the manufacturing process, and thus the cost can be lower.

Second Embodiment

Figure 13:
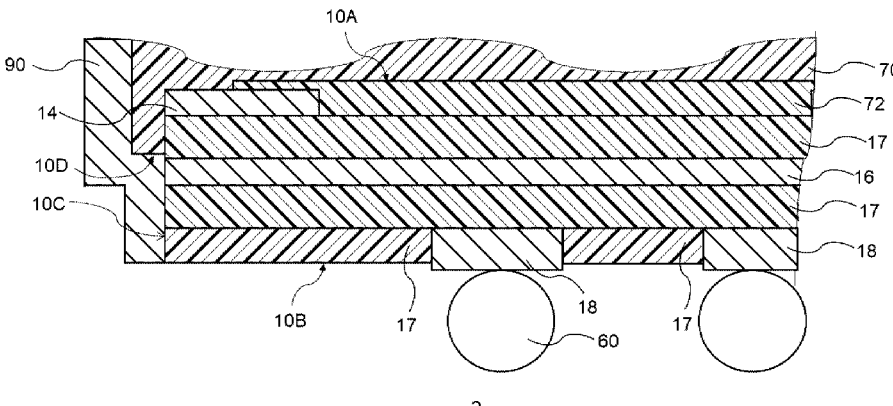
FIG. 13 is an enlarged cross-sectional view of a semiconductor device according to a second embodiment.

As shown in FIG. 13, in a semiconductor device 2 according to a second embodiment, the lower surface 10D of the resin layer 70 is located above the second surface 10B of the wiring substrate 10. The wiring layer 16 of the wiring substrate 10 is exposed from the resin layer 70. A metal layer 90 is provided on an outside of the resin layer 70. The metal layer 90 and the wiring layer 16 are connected. When the wiring layer 16 is not exposed from the resin layer 70, the metal layer 90 and the wiring layers 14 and 16 are not connected. The metal layer 90 may be a stacked film made of stainless-steel, copper, and stainless-steel. The metal layer 90 may be a stacked film of various kinds of metals or a single metal film.

In addition to the same effect as that of the semiconductor device 1 according to the first embodiment, since the metal layer 90 provides a shielding effect, electromagnetic wave radiation can be blocked or prevented. When the metal layer 90 and the wiring layer 16 are connected, since the wiring layer 16 is set to, for example, a ground potential, the metal layer 90 can also be set to the ground potential, the effect of blocking electromagnetic wave radiation is further enhanced.

Manufacturing Method

Figure 14:
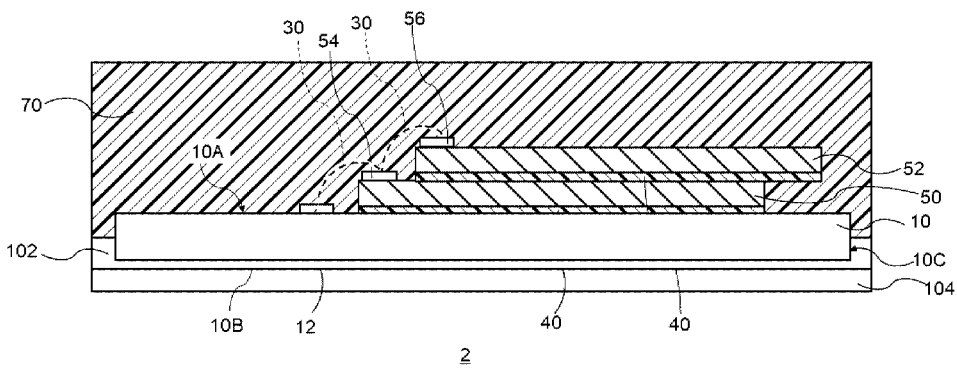
FIG. 14 shows aspects related to a method for manufacturing a semiconductor device according to a second embodiment.

FIG. 14 shows a method for manufacturing a semiconductor device according to the second embodiment. In step S2, the wiring substrate 10 is embedded in the support substrate 102. In this process, an upper surface of the support substrate 102 is kept from being located above the first surface 10A of the wiring substrate 10. Thus, when the resin layer 70 is formed, the resin layer 70 can be formed to cover only a part of the side surfaces of the wiring substrate 10. Thereafter, the metal layer 90 can be formed on the side surfaces of the resin layer 70 and the wiring substrate 10 by means such as sputtering. Even in this method, the same effect as that of the manufacturing method according to the first embodiment can be obtained.

Third Embodiment

Figure 15:
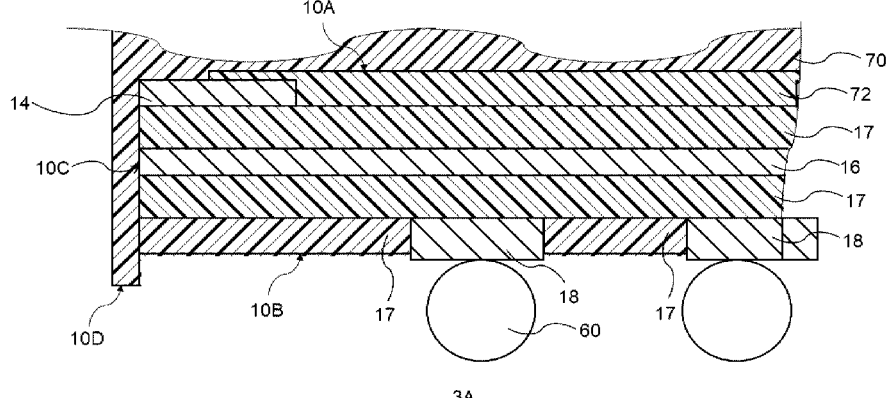
FIG. 15 is an enlarged cross-sectional view of a semiconductor device according to a third embodiment.
Figure 16:
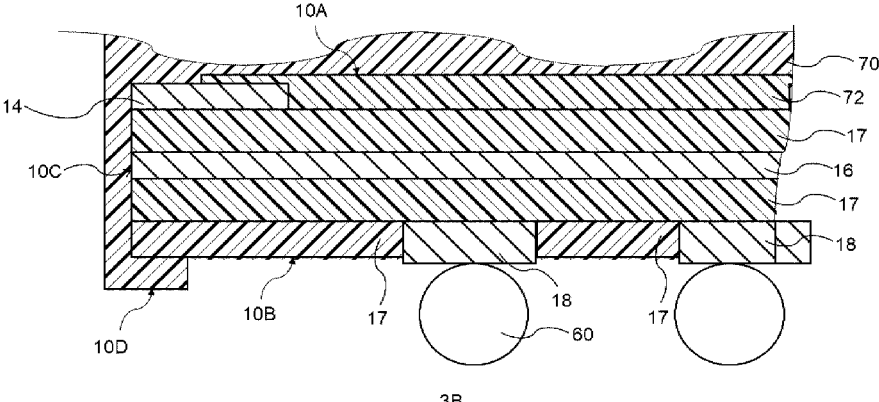
FIG. 16 is an enlarged cross-sectional view of another semiconductor device according to a third embodiment.

As shown in FIG. 15, in a semiconductor device 3A according to a third embodiment, the lower surface 10D of the resin layer 70 is located below the second surface 10B of the wiring substrate 10. Alternatively, as shown in FIG. 16, the lower surface 10D of the resin layer 70 of a semiconductor device 3B may cover a part of a lower side of the second surface 10B of the wiring substrate 10. The side surfaces of the wiring substrate 10 can be further protected as compared with the semiconductor device 1 according to the first embodiment.

Manufacturing Method

Figure 17:
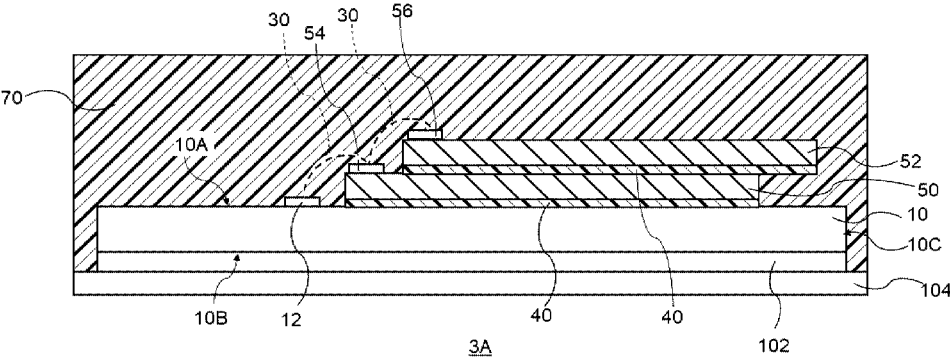
FIGS. 17 and 18 show aspects related to a method for manufacturing a semiconductor device according to a third embodiment.
Figure 18:
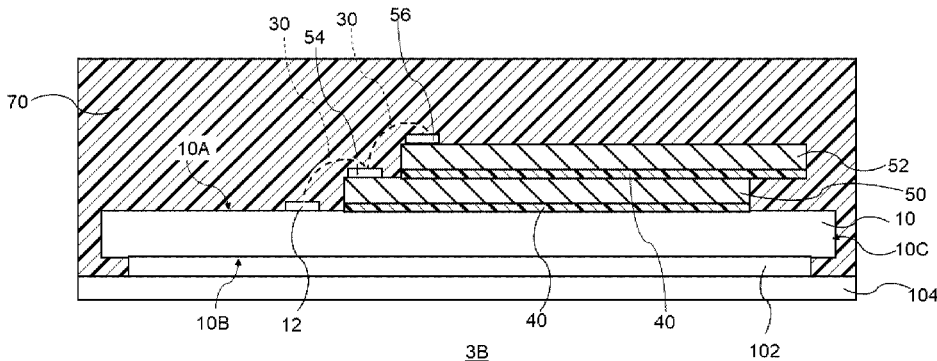

As shown in FIG. 17, in step S2, when viewed from above, the wiring substrate 10 and the support substrate 102 have substantially the same area and are disposed to overlap each other. As shown in FIG. 18, in step S2, when viewed from above, an area of the support substrate 102 is smaller than that of the wiring substrate 10, and the wiring substrate 10 is disposed to completely cover the support substrate 102. In this manner, the semiconductor devices 3A and 3B can be formed.

A method for arranging the wiring substrates 10 as shown in FIG. 17 is as follows.

(a) After the support substrate 102 is formed on the support substrate 104, a part of the support substrate 102 is removed and the support substrate 102 is diced with a laser, dicing, or the like. An area of the diced support substrate 102 is adjusted to be substantially equal to that of each wiring substrate 10. Thereafter, the wiring substrates 10 are disposed on the diced support substrates 102.

(b) The support substrate 102 is diced after being attached to a back surface of the wiring substrate 100. In this manner, the wiring substrates 10 are obtained in which the support substrate 102 having substantially the same area as that of the second surface 10B is formed on the second surface 10B of each wiring substrate 10. The wiring substrates 10 are disposed on the support substrate 104. In the above (a) and (b), the same effect as that of the manufacturing method according to the first embodiment can also be obtained.

A method for arranging the wiring substrates 10 as shown in FIG. 18 is as follows.

(c) After the support substrate 102 is formed on the support substrate 104, a part of the support substrate 102 is removed and the support substrate 102 is diced with a laser, dicing, or the like. Thereafter, the wiring substrates 10 are disposed on the diced support substrates 102. An area of the diced support substrate 102 is made smaller than that of each wiring substrate 10.

(d) The support substrate 102 is attached to the back surface of the wiring substrate 100. Thereafter, a part of the support substrate 102 is removed from the back surface side by a laser or the like. Thereafter, the wiring substrate 100 is diced. In this manner, the wiring substrates 10 are obtained in which the support substrate 102 having an area smaller than that of the second surface 10B is on the second surface 10B of each wiring substrate 10. The wiring substrates 10 are disposed on the support substrate 104. In the above (c) and (d), the same effect as that of the manufacturing method according to the first embodiment can also be obtained.

Fourth Embodiment

Figure 19:
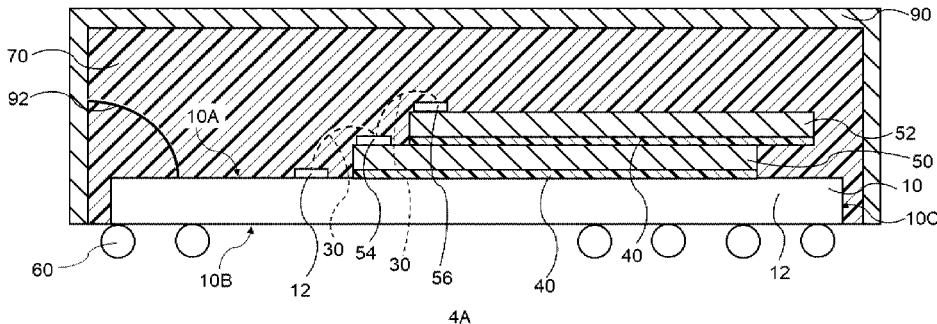
FIG. 19 is a cross-sectional view of a semiconductor device according to a fourth embodiment.
Figure 20:
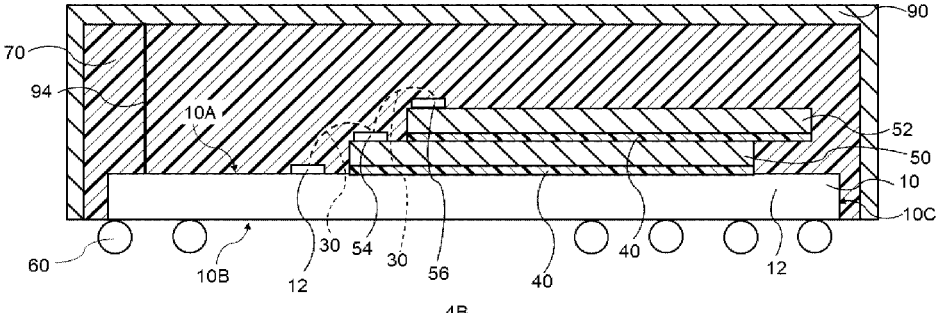
FIG. 20 is a cross-sectional view of another semiconductor device according to a fourth embodiment.

As shown in FIG. 19, in a semiconductor device 4A according to a fourth embodiment, a wire 92 extending from a pad on the first surface 10A of the wiring substrate 10 is connected to the metal layer 90 on the side surface. As shown in FIG. 20, in a semiconductor device 4B according to the fourth embodiment, a wire 94 extending from a pad on the first surface 10A of the wiring substrate 10 is connected to the metal layer 90 on the upper surface. In addition to the same effect as that of the semiconductor device 1 according to the first embodiment, an effect of preventing electromagnetic wave radiation is obtained.

When the pad to which wire 92 or 94 is attached is at a ground potential (a ground pad), the effect of preventing electromagnetic wave radiation of the metal layer 90 is further enhanced.

Manufacturing Method

Figure 21:
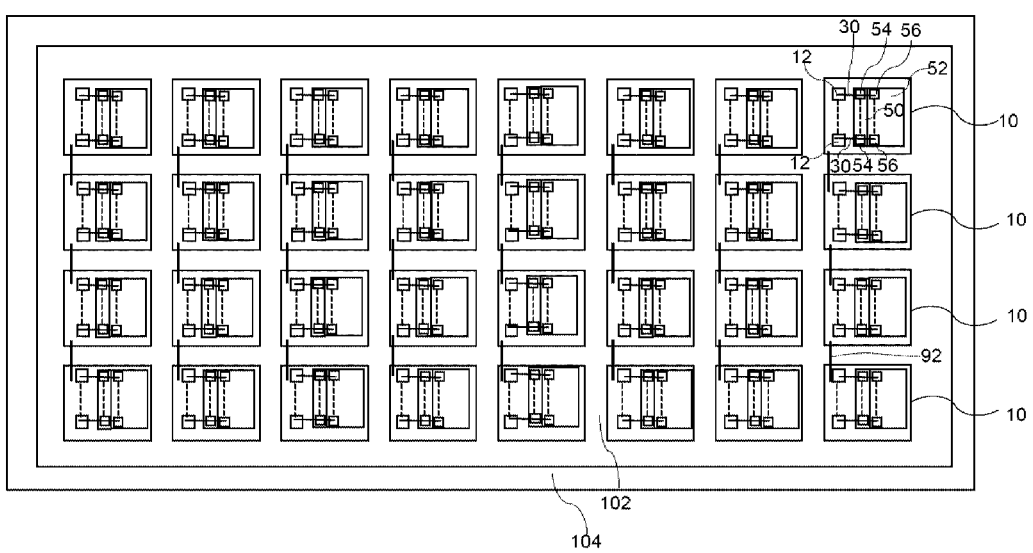
FIGS. 21 to 23 show aspects related to a method for manufacturing a semiconductor device according to a fourth embodiment.

As shown in FIG. 21, in step S5, in addition to the bonding wires 30, adjacent wiring substrates 10 are connected by the wire 92. Thereafter, in step S6, the resin layer 70 is formed. Thereafter, in step S7, when the resin layer 70 is cut, a cross-section of the wire 92 appears at the cut surface. When the metal layer 90 is formed, the cross-section of the wire 92 and the metal layer 90 will be connected. In this manner, the semiconductor device 4A is formed.

Figure 22:
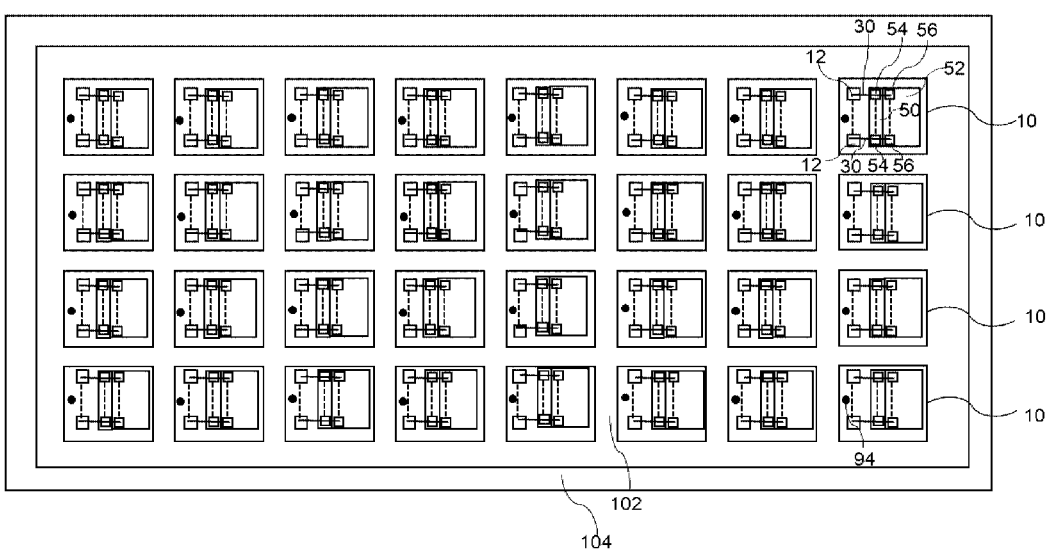
Figure 23:
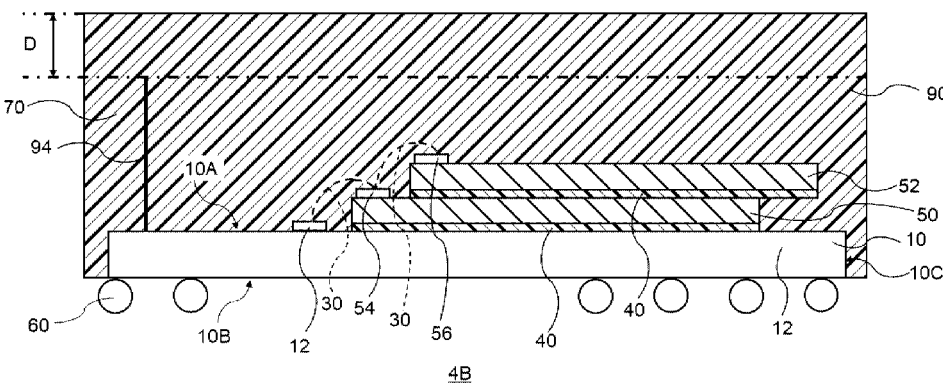

As shown in FIG. 22, in step S5, in addition to the bonding wires 30, the wire 94 extending from a pad on the first surface 10A of the wiring substrate 10 along a vertical direction is formed. As shown in FIG. 23, the resin layer 70 is formed to be thick in step S6. Thereafter, when a surface of the resin layer 70 is polished, ground, or the like to remove a thickness D corresponding to an interval between alternate long and short dash lines, a cross-section of the wire 94 appears. Here, the side surfaces of the resin layer 70 are cut with a dicer, a laser, or the like. Therefore, the surface roughness may be different between the side surfaces and the upper surface of the resin layer 70. Alternatively, for example, when a blade that cuts the side surfaces of the resin layer 70 has the same particle size as that of a blade that grinds the upper surface, the side surface and the upper surface of the resin layer 70 may have the same surface roughness. When the metal layer 90 is formed, the cross-section of the wire 94 and the metal layer 90 are connected. In this manner, the semiconductor device 4B is formed. Even in this manner, the same effect as that of the manufacturing method according to the first embodiment can be obtained.

Fifth Embodiment

Figure 24:
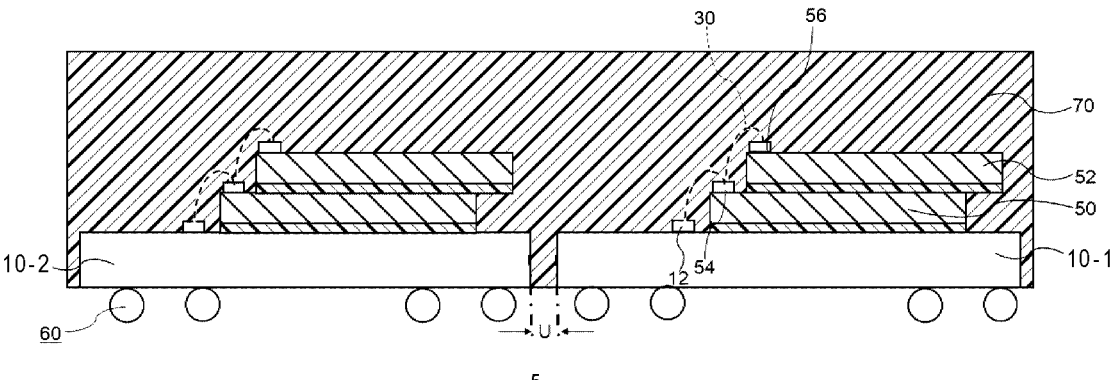
FIG. 24 is a cross-sectional view of a semiconductor device according to a fifth embodiment.

As shown in FIG. 24, a semiconductor device 5 includes a plurality of wiring substrates 10-1 and 10-2. The resin layer 70 is formed between the wiring substrates 10-1 and 10-2. The same effect as that of the semiconductor device 1 according to the first embodiment can be obtained.

Figure 25:
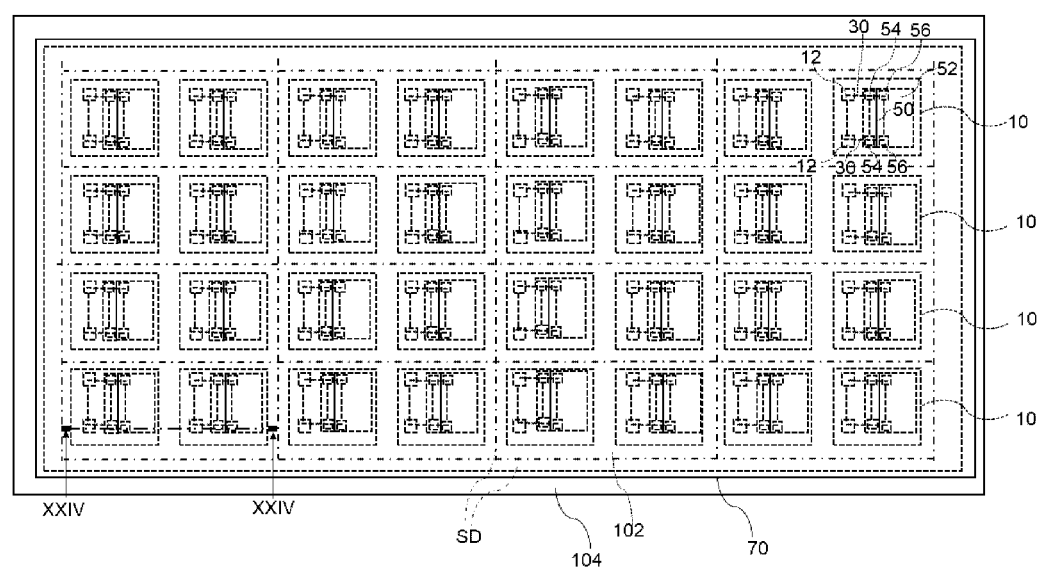
FIG. 25 shows aspects related to a method for manufacturing a semiconductor device according to a fifth embodiment.

The semiconductor device 5 can be manufactured by cutting along the cutting line SD as shown in FIG. 25 in step S7. An area between the wiring substrates 10-1 and 10-2 is an area (unused area U) that is not used as wiring. Therefore, when the wiring substrates 10-1 and 10-2 are formed as one integrated block, since the area U is included in the block, the cost of the wiring substrate increases since some portion of the original wiring substrate 100 will remain unused. In the present embodiment, the area U is filled the resin layer 70 and no portion of the original wiring substrate 100 will have to be left unused, so that the cost is lower.

Another Embodiment (I) In the manufacturing methods according to the above embodiments, steps S8 and S9 may be performed after step S6, and then step S7 may be performed to form the semiconductor devices 1 to 5. In such a process, the bump electrodes 60 can be formed more easily than in the case in which the bump electrodes 60 are formed on the already diced wiring substrates 10.

(II) In the manufacturing methods according to the above embodiments, a photosensitive adhesive may be used as the support substrate 102. With this, it is generally easier to arbitrarily change a shape of the support substrate 102 incorporated into the final semiconductor device.

(III) In the manufacturing methods according to the above embodiments, the support substrate 102 is adhered to the support substrate 104. In other examples, the resin layer 70 may instead be directly formed only on the support substrate 102 without use of a support substrate 104. Since the support substrate 104 is not used, the cost can be lower.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a wiring substrate with a first surface, a second surface opposite to the first surface, and a side surface connecting the first surface and the second surface;
   a first electrode on the first surface;
   a plurality of semiconductor chips on the wiring substrate at least one semiconductor chip in the plurality being electrically connected to the first electrode;
   a resin layer covering the plurality of semiconductor chips and the first surface from a first direction orthogonal to the first surface, a portion of the resin layer contacting the side surface of the wiring substrate from a second direction parallel to the first surface;
   an external terminal on the second surface of the wiring substrate; and
   a solder ball on the external terminal, wherein
   the resin layer extends in the second direction to a position beyond the side surface of the wiring substrate,
   the resin layer has an outside side surface that is substantially parallel to the first direction, and
   a bottom surface of a lowermost insulator layer formed in the semiconductor device and a bottom surface of the resin layer are substantially co-planar.

2. The semiconductor device according to claim 1, further comprising:
   a metal film on the outside surface of the resin layer and a portion of the side surface of the wiring substrate.

3. The semiconductor device according to claim 2, wherein the metal film is directly connected to a wiring inside the wiring substrate at the side surface of the wiring substrate.

4. The semiconductor device according to claim 2, further comprising:
   a wire in the resin layer with one end connected to the wiring substrate and another end connected to the metal film.

5. The semiconductor device according to claim 1, wherein the at least one semiconductor chip in the plurality is electrically connected to the first electrode by a bonding wire in the resin layer.

6. The semiconductor device according to claim 1, wherein the lowermost insulator layer is an insulating layer in the wiring substrate.

* * * * *